United States Patent
Wang et al.

(10) Patent No.: US 8,773,664 B1
(45) Date of Patent: Jul. 8, 2014

(54) METHOD AND SYSTEM FOR ALIGNING SUBSTRATES FOR DIRECT LASER COUPLING IN AN ENERGY ASSISTED MAGNETIC RECORDING HEAD

(75) Inventors: Lei Wang, Fremont, CA (US); William J. Kozlovsky, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 219 days.

(21) Appl. No.: 13/332,293

(22) Filed: Dec. 20, 2011

(51) Int. Cl.
*G01B 11/00* (2006.01)
*G03F 7/20* (2006.01)
*G01B 11/27* (2006.01)
*G03F 9/00* (2006.01)

(52) U.S. Cl.
CPC ............ *G03F 7/70633* (2013.01); *G01B 11/27* (2013.01); *G03F 9/70* (2013.01); *G03F 9/7076* (2013.01)
USPC ............................. 356/401; 356/399; 356/400

(58) Field of Classification Search
CPC ..... G03F 7/70633; G03F 9/70; G03F 9/7076; G03F 9/7088; G03F 9/7049; G03F 7/70358; G01B 11/27; G01B 11/272; H01L 21/681
USPC .................................................. 356/399–401
See application file for complete search history.

(56) References Cited

U.S. PATENT DOCUMENTS

| | | | |
|---|---|---|---|
| 5,357,536 A * | 10/1994 | Andrews | 372/50.12 |
| 6,627,096 B2 | 9/2003 | Sherrer et al. | |
| 6,838,689 B1 | 1/2005 | Deng et al. | |
| 7,502,397 B2 | 3/2009 | Naganuma | |
| 7,522,649 B2 | 4/2009 | Ha et al. | |
| 8,012,804 B1 * | 9/2011 | Wang et al. | 438/110 |
| 8,488,435 B2 * | 7/2013 | Snyder | 369/112.27 |
| 2002/0110335 A1 | 8/2002 | Wagner et al. | |
| 2002/0163865 A1 | 11/2002 | Zimmer et al. | |
| 2008/0316872 A1 | 12/2008 | Shimizu et al. | |
| 2012/0163137 A1 * | 6/2012 | Wang et al. | 369/13.02 |

* cited by examiner

*Primary Examiner* — Tarifur Chowdhury
*Assistant Examiner* — Isiaka Akanbi

(57) ABSTRACT

A method and system align a laser diode on a first substrate to a waveguide on a second substrate. The first substrate includes an edge and a first surface adjoining the edge. The laser diode has an emission exit on the edge. The second substrate includes a back side and a side edge. The waveguide has a waveguide input on the back side and directs light along the side edge. A first alignment mark set on the first substrate is aligned to a second alignment mark set on the second substrate. The first alignment mark set corresponds to the emission exit, is formed on the first surface and is visible from the edge. The second alignment mark set corresponds to the waveguide input, is formed on the side edge, and is visible from the back side. The first substrate's edge is affixed to the second substrate's back side.

25 Claims, 8 Drawing Sheets

METHOD AND SYSTEM FOR ALIGNING SUBSTRATES FOR DIRECT LASER COUPLING IN AN ENERGY ASSISTED MAGNETIC RECORDING HEAD

BACKGROUND

In fabricating disk drives, such as energy assisted magnetic recording (EAMR) disk drives, it may be necessary to bond components together. For example, in conventional EAMR disk drives, a laser provides energy used to heat the media for magnetic recording. The laser typically takes the form of a laser diode. The laser diode may be desired to be aligned with a waveguide on the slider and bonded with the slider.

FIG. 1 depicts a conventional method 10 for bonding two substrates, such as a conventional laser diode (or substrate on which the laser diode resides) and a slider. FIGS. 2-3 depict a conventional EAMR head 50 during fabrication using the conventional method 10. FIG. 2 depicts a plan view of the substrates 60 and 70. Thus, two conventional substrates, a slider 60 and a laser diode 70 are shown. Each conventional substrate 60 and 70 includes conventional two-dimensional alignment marks 62 and 72, respectively. Although depicted as squares in FIG. 2, the alignment marks 62 and 72 may have a variety of shapes, including but not limited to interlocking shapes. Each conventional substrate 60 and 70 also includes conventional solder pads 64 and 74, respectively. The conventional substrates 60 and 70 are aligned, via step 12. Typically this is accomplished by aligning the alignment marks 62 on one substrate 60 with the alignment marks 72 on the other substrate 72. FIG. 3 depicts the conventional substrates 60 and 70 after step 12. Thus, the alignment marks 62 and 72 and solder pads 64 and 74 are aligned. The alignment marks 62 and 72 are two-dimensional alignment marks viewable from the planar surfaces of the substrates 60 and 70 on which the solder pads 64 and 74 reside and which are being aligned. Thus, the alignment marks 62 and 72 are depicted as dashed lines in FIG. 3. Once alignment has been achieved, the substrates 60 and 70 are heated to reflow the solder 64 and 74. Mechanical and electrical connection is made between the substrates 60 and 70 by pads 64'/74', which have been reflowed together.

Although the conventional method 10 may function, the method 10 may be problematic for certain technologies. For example, an edge emitting laser may be desired to be used. An edge emitting layers has an emission exit for laser light on the edge of the substrate. The edge emitting layers may be aligned as shown in FIGS. 1-3. However, in such a case, optical components (not shown) may be required to redirect light from the edge of the laser diode 70 to a waveguide on the substrate/slider 60. If the emission edge is to be oriented closest to the slider 60, then the conventional substrate 70 would be placed such that an edge is closest to the substrate/slider 60. Thus, the conventional substrate/laser diode 70 would be oriented perpendicular to what is shown in FIGS. 2-3. In such a case, however, alignment using two-dimensional alignment marks 62 and 72 may be difficult to accomplish. Fabrication of conventional two-dimensional alignment marks on the edge of the substrate 70 may be challenging. Conversely, alignment without such marks may be extremely difficult to accomplish.

Accordingly, what is needed are improved methods and systems for aligning substrates, for example in alignment of substrates used in EAMR disk drives.

BRIEF SUMMARY OF THE INVENTION

A method and system align a laser diode on a first substrate to a waveguide on a second substrate. The first substrate includes an edge and a first surface adjoining the edge. The laser diode has an emission exit on the edge. The second substrate includes a back side and a side edge. The waveguide has a waveguide input on the back side and is configured to direct light along the side edge. A first alignment mark set on the first substrate is aligned to a second alignment mark set on the second substrate. The first alignment mark set corresponds to the emission exit, is formed on the first surface and is visible from the edge. The second alignment mark set corresponds to the waveguide input, is formed on the side edge, and is visible from the back side. The edge of the first substrate is affixed to the back side of the second substrate.

DETAILED DESCRIPTION OF EMBODIMENTS OF THE INVENTION

Figure 1:
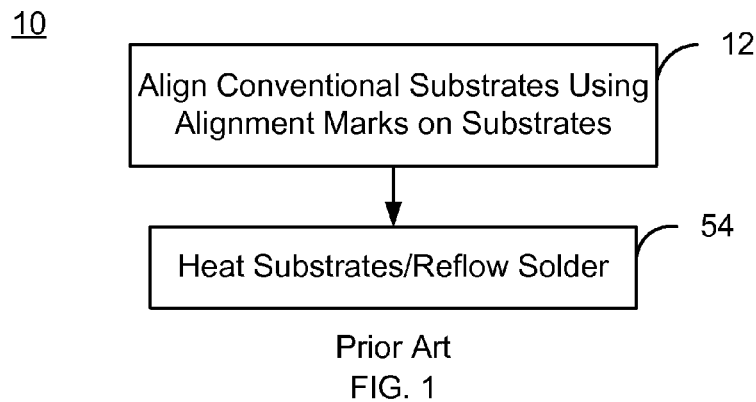
FIG. 1 is a flow chart depicting a conventional method for bonding a conventional laser diode and a conventional slider.
Figure 2:
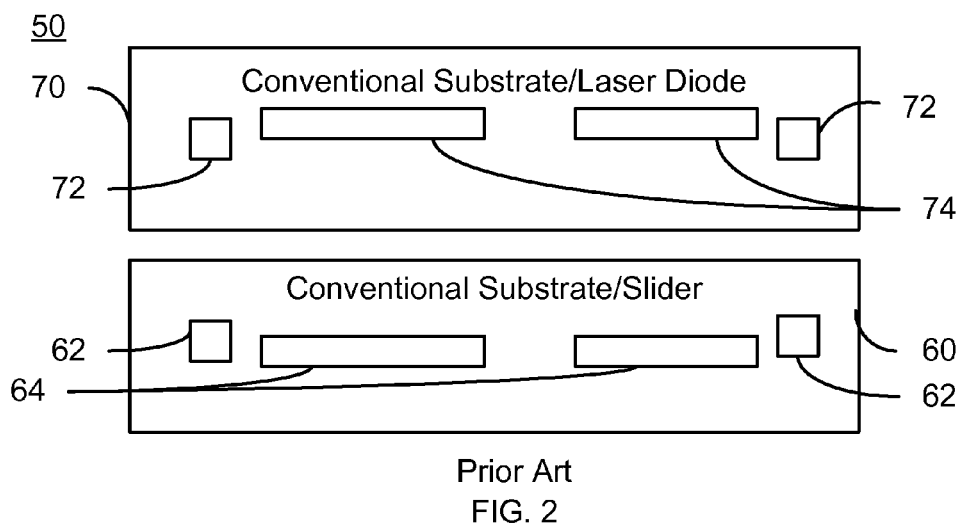
FIGS. 2-3 are diagrams depicting the conventional laser diode and slider during bonding.
Figure 3:
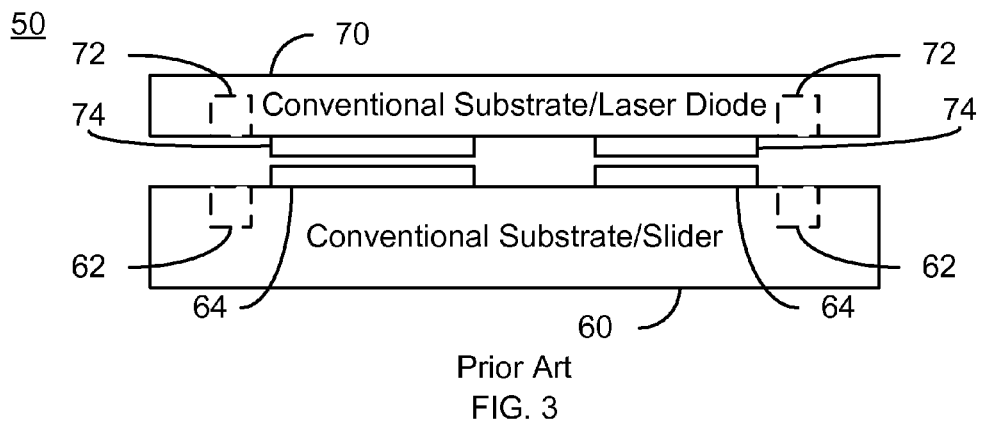
Figure 4:
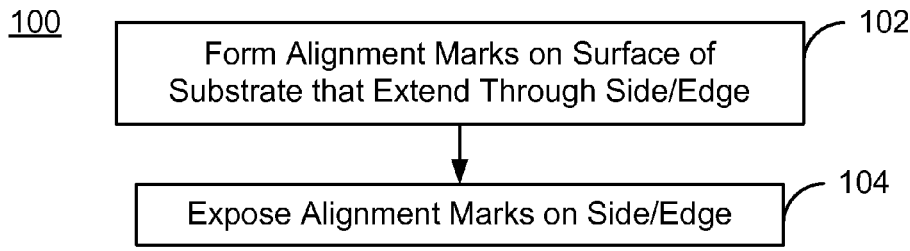
FIG. 4 is a flow chart depicting an exemplary embodiment of a method for forming alignment marks, for example for use in fabrication of an EAMR head.
Figure 5:
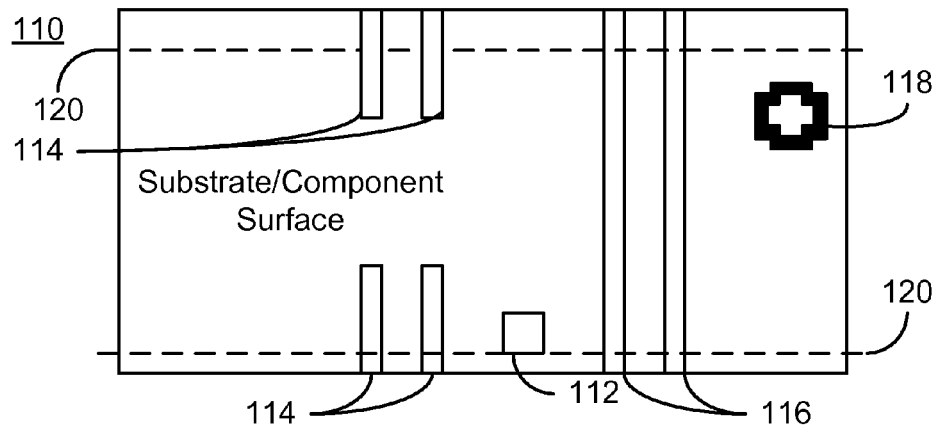
FIGS. 5-7 are plan and edge views depicting an exemplary embodiment of substrates to be bonded.
Figure 6:
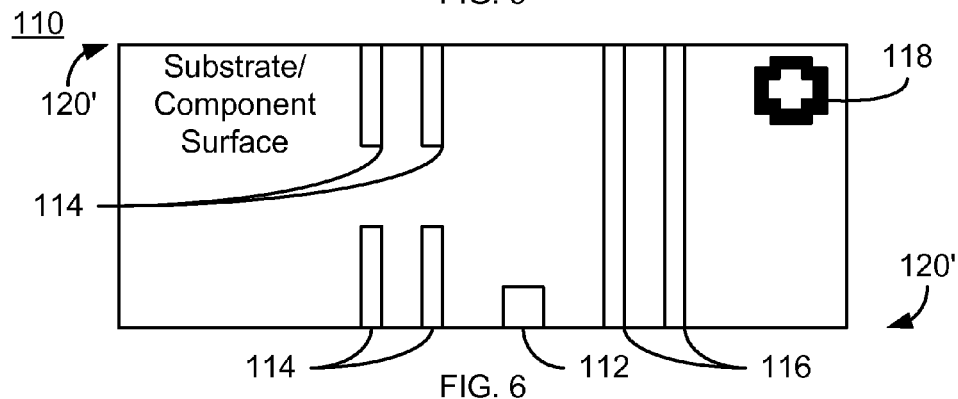
Figure 7:
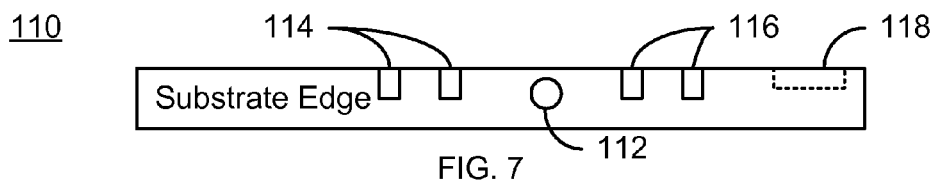

FIG. 4 is a flow chart depicting an exemplary embodiment of a method 100 for aligning substrates, for example in fabrication of an EAMR head. For simplicity, only some steps are shown. Further, the steps may include one or more substeps. Steps may also be combined, interleaved, and/or performed in another order. FIGS. 5-7 are diagrams depicting side and plan views of a substrate 110 during fabrication. For clarity, FIGS. 5-7 are not to scale. Further, for simplicity, not all components are labeled in FIGS. 5-7. The substrate 110 may be a slider including an EAMR transducer, a laser diode formed in a semiconductor substrate, or another device. Referring to FIGS. 4-7, the method 100 is described in the context of substrates used in fabricating an EAMR head. However, the method 100 may be used to form another device (not shown). The EAMR head 120 being fabricated may be part of a merged head that also includes a read transducer (not shown in FIGS. 5-7) and resides on a slider of a disk drive.

Alignment marks are formed on the surface of the substrate, via step 102. The alignment marks formed in step 102 extend through portions of the substrate at which will form the edges. FIG. 5 depicts the substrate 110 after step 102 is performed. Shown in FIG. 5 are component 112 which is desired to be aligned, lines 120 and two-dimensional alignment mark 118. As can be seen in FIG. 5, a portion of the component 112 is at the location of the side/edge. Although depicted in the plan view, the component 112 need not be on the top surface of the substrate 110. However, it is generally desired that the depth of the component 112 be known. Conventional two-dimensional alignment mark 118 may be used in other alignment procedures. However, this two-dimensional alignment mark 118 may not be used in the edge alignment described herein. Thus, in some embodiments, the two-dimensional alignment mark 118 may be omitted. Also shown are lines 120 that indicate the locations of the edges/sides of the substrate 110 that are to be used in alignment. If the substrate 110 is a laser diode, for example, the lines 120 may represent lines of cleavage. If the substrate 110 is a slider for an EAMR head, the lines 120 may represent the target locations to which the substrate 110 is to be lapped.

Also shown in FIG. 5 are alignment marks 114 and 116 formed in step 102. In some embodiments, the alignment marks 114 and/or 116 are trenches. In other embodiments, the alignment marks 114 and/or 116 could be deposited structures. For example, the alignment marks 114 and/or 116 could be one material encased in another material such that optical contrast is achieved for alignment. In one embodiment, the alignment marks 114 and 116 are metal bars that have been encased in a dielectric. Such metal bars may be formed from materials including but not limited to NiFe and/or Cu. As can be seen in FIG. 5, the alignment marks 114 extend through one line 120, while the alignment marks 116 extend through both lines 120. However, in some embodiments, only one set of alignment marks 114 at one line may be fabricated. Further, although alignment marks 114 and 116 are shown on either side of the component 112, alignment might be achieved with mark(s) on only one side of the component. Further, another number of alignment marks might be used. For example, a single alignment mark might be used, a single pair of alignment marks (both on one side or bracketing the component 112), or another number of alignment marks might be used.

Step 102 may include forming the alignment marks 114 and/or 116 photolithographically. For example, a mask having apertures may be provided using photolithography. Material may be deposited to form bars, or the substrate 110 may be etched to form trenches under the apertures. The etch may be a dry etch such as a reactive ion etch (RIE) which can form trenches having substantially vertical sidewalls. In other embodiments, a wet etch may be used. The wet etch may result in trenches having angled sidewalls because some crystallographic planes of the substrate 110 may etch faster than others. In some embodiments, the trench(es) provided in step 102 may have a depth of at least two and not more than ten microns. In some such embodiments, the depth of the trenches may be at least three and not more than five microns. In other embodiments, a metal layer may be deposited, then a mask having apertures corresponding to the alignment marks may be photolithographically provided. Portions of the metal layer exposed by the mask may then be removed. The remaining portions of the metal layer may form the alignment marks 114 and/or 116. Further, such alignment marks may be encased in a dielectric. Thus, the location and shape of the alignment marks 114 and/or 116 may be well determined. For example, their shape and location may be known to within one micron or less. In some embodiments, the variations in the shape and location of the alignment marks 114 and/or 116 may be on the order of the uncertainties in photolithography, which are much smaller than one micron. More specifically, the shape and location of the alignment marks 114 and 116 or features of the alignment marks 114 and 116, such as their edges, are well defined with respect to the component 112 to be aligned.

The alignment marks 114 and 116 are exposed at the side, or edge, of the substrate 110, via step 104. In some embodiments, the substrate 110 is cleaved along the line of cleavage. For example, if the substrate 110 is for a laser diode, then the semiconductor substrate may be cleaved along the lines 120. In other embodiments, the substrate 110 may be lapped. For example, if the substrate 110 is a slider for a laser, then the portion of the slider corresponding to the back side may be lapped in step 104.

FIGS. 6-7 depict plan and side/edge views of the substrate 110 after step 104 is performed. The edges 120' corresponding to the lines 120 have been exposed. The component 112 may thus be exposed. For example, if the substrate 110 is for a laser diode, the component 112 may be the emission exit for the edge-emitting laser. If the substrate 110 is for an EAMR transducer, then the component 112 may be an entrance for a waveguide on the back side of the slider. The waveguide would typically lie along the trailing surface of the EAMR transducer. Also exposed are the alignment marks 114 and 116. More specifically, the alignment marks 114 and 116 may be visible from the side/edge, as can be seen in FIG. 7. In addition, note that the alignment marks 116 may be visible from either edge 120' of the substrate 110'.

Using the method 100, alignment marks 114 and 116 may be formed by fabricating the marks 114 and/or 116 on the surface of the substrate 110, but are visible at the edge/side of the substrate 110. As a result, the alignment marks 114 and/or 116 may be used to align the component 112 at the side/edge of the substrate 110 with another component (not shown) on another substrate (not shown). Because the marks 114 and/or 116 may be formed using one or more photolithographic processes, the locations, sizes, and geometry of the alignment marks 114 and/or 116 may be well known. More particularly, the locations, sizes, and geometry of the alignment marks 114 and/or 116 with respect to the component 112 are well known. Consequently, alignment of the component 112 on the substrate 110 to a device (not shown) on another substrate may be facilitated.

Figure 8:
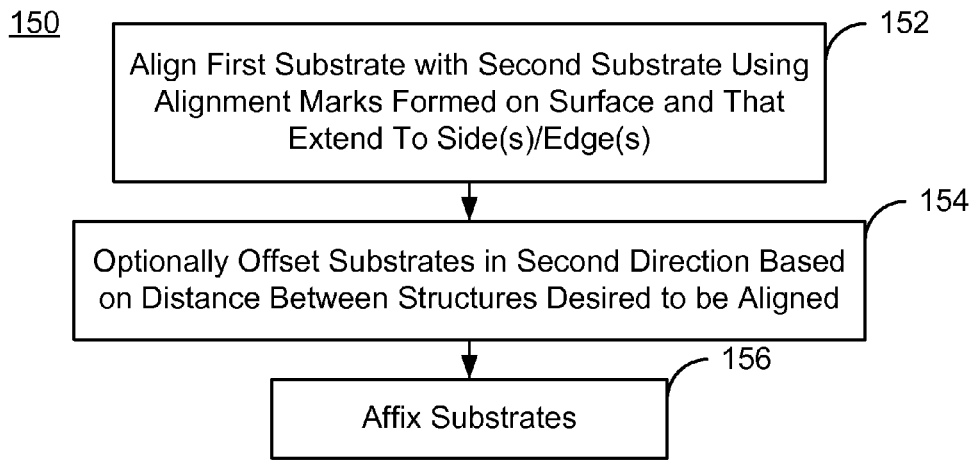
FIG. 8 is a flow chart depicting an exemplary embodiment of a method for aligning substrates for use in fabricating an EAMR head.

FIG. 8 depicts an embodiment of a method 150 for aligning two substrates. For simplicity, some steps may be omitted and some steps may include substep(s). Further, the steps of the method may be combined, interleaved, and/or performed in another order. The method 150 is described in the context of aligning a laser diode on a first substrate to waveguide on a second substrate. However, in other embodiments, the method 150 may be used for aligning other substrates and/or other components. However, the method 150 may be used to form another device (not shown). FIGS. 9-12 are diagrams depicting substrates 210 and 230 during fabrication of the EAMR head. More specifically, FIGS. 9-12 depict substrates 210 and 230 during alignment and bonding. For clarity, FIGS. 9-12 are not to scale. Further, for simplicity, not all components are shown or labeled in FIGS. 9-12. The substrate 230 may be a slider including an EAMR transducer. The substrate 210 may be a semiconductor substrate for a laser diode. Referring to FIGS. 8-12, the method 150 is described in the context of substrates used in fabricating an EAMR head. The EAMR head 120 being fabricated may be part of a merged head that also includes a read transducer (not shown in FIGS. 9-12) and resides on a slider of a disk drive.

An alignment mark set on the first substrate is aligned to a second alignment mark set on the second substrate, via step 152. In some embodiments, step 152 includes aligning the midpoint of some alignment marks 216 to the midpoint of other alignment marks 238. In other embodiments, however, the alignment marks 216 and 238 may be aligned to different locations.

Figure 9:
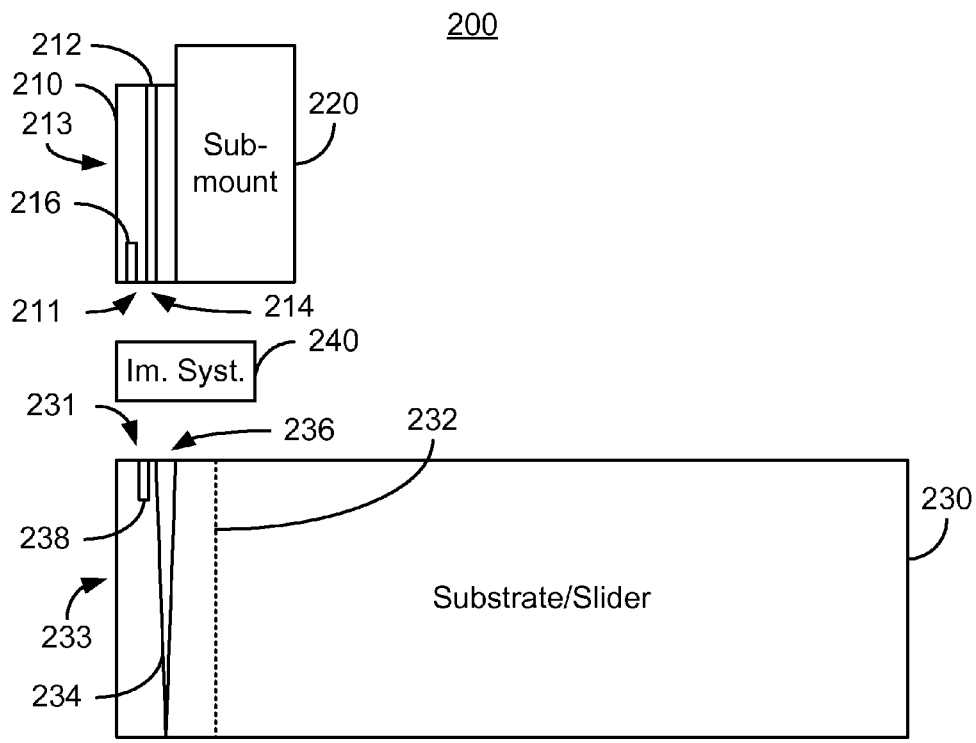
FIG. 9 is a side view depicting an exemplary embodiment of substrates during alignment.

In some embodiments, step 152 is performed using a flip chip bonding system. In some embodiments, step 152 is carried out at a temperature that is close to that at which the substrates will be bonded in order to account for any changes in shape of the substrates due to thermal expansion. One such system is depicted in FIG. 9. However, in other embodiments other analogous system might be used. The system shown in FIG. 9 utilizes a camera or other imaging system 240. A first substrate 210 that includes a laser diode 212 having emission exit 214 is shown. The emission exit 214 is on the edge 211 of the substrate 210. The substrate 210 includes a first alignment mark set 216 that has been formed on the surface 213 of the substrate 210. However, the alignment marks 216 are visible from the edge 211. Although formed on the surface 213 of the substrate 210, other components may be formed on top of the alignment marks 216 and laser diode 212. Thus, these components 212 and 216 are not depicted at the edge of the surface 213 of the substrate 210. Although not shown, in another embodiment, another alignment marked corresponding to the alignment mark 216 may be fabricated at the back edge of the laser diode substrate 210. In still another embodiment, the alignment mark 216 may extend from the edge 211 to the opposite, back edge. Also shown is the submount 220 to which the laser substrate 210 may be bonded. The second substrate 230 is a slider including a device region in which an EAMR transducer 232 having a waveguide 234 has been formed. The waveguide 234 is formed on the trailing edge 233 of the slider 230, but has a waveguide exit/entrance 236 on the back side 231 of the slider 230. Note, however, that during fabrication, the trailing edge 233 of the slider 230 is actually the surface of the wafer on which structures are formed. Further, although formed at the trailing edge 233, other components may be formed on top of the waveguide 234 and/or alignment marks 238. Thus, these components 234 and 238 are not depicted at the back edge of the substrate 230. However, in another embodiment, the components 234 and 238 may be located on the trailing edge of the substrate 230. Thus, the slider 230 also includes alignment marks 238 and other structures 239 formed on the trailing edge 233. However, the alignment marks 238 are visible on the back side 231. The alignment marks 216 and 238 may each be formed using the method 100. Thus, the alignment marks 216 and 238 may have been photolithographically formed. In one embodiment, the alignment marks 216 are trenches etched in the surface 213 of the laser diode substrate 210. In one such embodiment, the alignment marks 238 are metal bars fabricated on the trailing edge 233 of the substrate 230. However, the alignment marks 216 are visible from the edge 211. Similarly, the alignment marks 238 are visible from the back side 231. The alignment marks 216 and 218 may be other structures formed in another manner. However, the alignments marks 216 and 218 would be formed on one surface 213 and 233, respectively, but be visible from an edge 211 and 231, respectively. Thus, the alignment marks 216 and 218 may be formed using the method 100.

The imaging system 240 may be a camera capable of imaging the edge 211 of the substrate 210 as well as the back side 231 of the slider 230. In the embodiment shown, therefore, the imaging system 240 is between the substrates 210 and 230. Using the alignment marks viewed by the imaging system 240, the substrates 210 and 230 may be aligned to each other using the alignment marks 216 and 238. In another embodiment, a different imaging system may be used. For example, such an imaging system may use the edge of the substrate 210 that is opposite to the edge 211 for alignment. In such embodiments, the alignment mark 216 would either extend through the substrate 210 or have a matching alignment mark on the opposite edge. In such systems, the top edges of the substrates 210 and 230 might be used for alignment.

Figure 10:
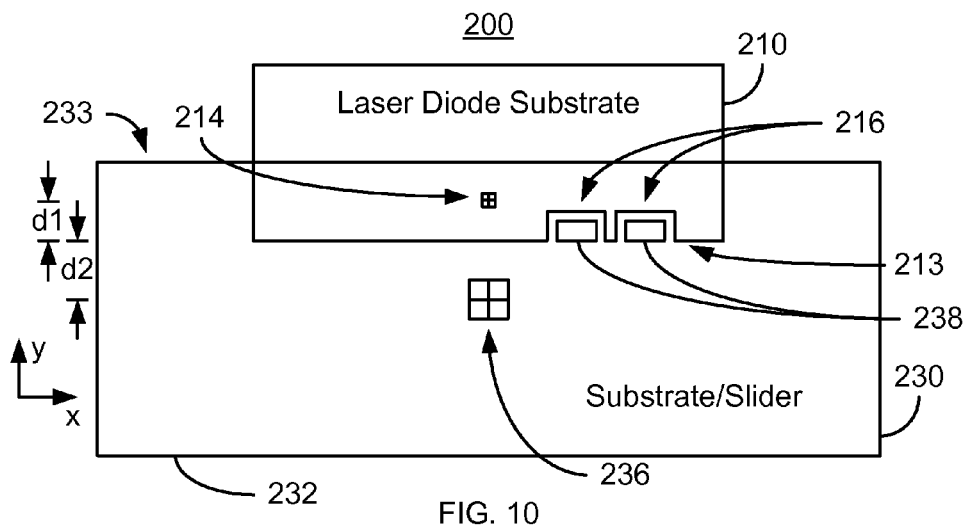
FIG. 10 is a side view depicting an exemplary embodiment of substrates after alignment.

FIG. 10 depicts the substrates 210 and 230 after alignment in step 102. The views of the substrates 210 and 230 shown in FIG. 10 may be considered to be the views of the edge 211 and back side 231, respectively, seen by the imaging system 240, which may be superimposed on each other. For clarity, the submount 220 is not shown in FIG. 10. Thus, the alignment marks 216 on the laser diode substrate 210 have been aligned to the alignment marks 238 on the slider 230. Note that in the embodiment shown, the alignment marks 216 and 238 are aligned such that the alignment marks 238 (metal bars) fit within the alignment marks 216 (trenches). In other embodiments, the alignment marks 216 and 238 may be configured in a different manner. For example, an alignment mark 238 may be between two alignment marks 216, may simply be adjacent to an alignment mark 216 or have some other well defined relationship to the alignment mark 216.

In the embodiment shown, alignment in step 102 using the alignment marks 216 and 238 aligns the laser emission exit 214 with the waveguide entrance 236 in the x direction depicted in FIG. 10. However, the laser emission exit 214 may still be still offset from the waveguide entrance 236 in the y direction. However, because of the nature of their formation, the distance, d1, between the surface 213 and the emission exit 214 is well defined. For example, it may be known that that the laser emission exit 214 is 1.4 microns from the surface 233. Similarly, because the waveguide 232 and alignment marks 238 are formed using photolithography, the distance the alignment marks 238 and the waveguide entrance 234 in the y-direction, d2, may be well defined. Step 102 has thus aligned the laser diode 210/emission exit 212 to the slider 230/waveguide entrance 236 in the x direction. The substrates 210 and 230 are then offset in the y-direction, via step 154. Stated differently, the substrates 210 and 230 are offset in the y-direction by a distance d1+d2 to account for the distances d1 and d2 in the y-direction. Note that although described as a separate step, step 154 may be considered to be part of the alignment performed in step 152. Alternatively, in some embodiments, in which there are no offsets, step 154 may be omitted.

Figure 11:
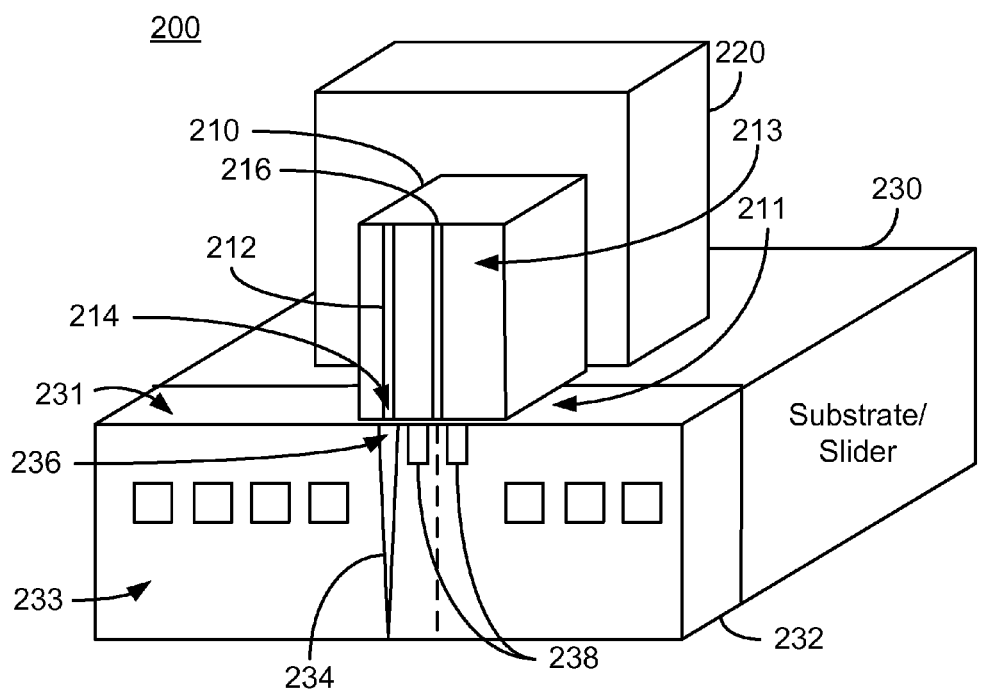
FIGS. 11-12 are a perspective and side views depicting an exemplary embodiment of substrates to be bonded after alignment.
Figure 12:
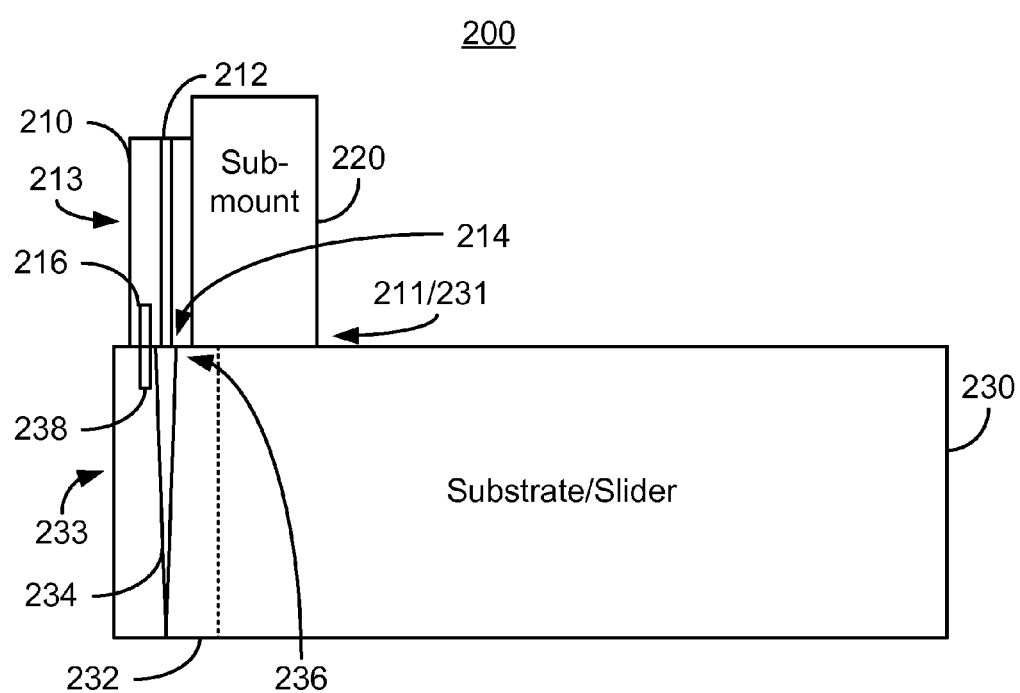

The edge 211 of the substrate 210 is affixed to the back side 231 of the substrate 230, via step 154. In some embodiments, step 154 includes reflowing solder pads (not shown) that exist on the substrates 210 and 230. FIGS. 11-12 depict perspective and side views of the substrates 210 and 230 after alignment and bonding. Thus, the emission exit 214 of the laser diode substrate 210 has been aligned with the waveguide entrance 236. In some embodiments, the alignment of the emission exit 214 with the waveguide entrance 236 may be to within less than one micron. In some embodiments this alignment is to within 0.5 micron. Also, in the embodiment shown in FIG. 11, a single trench alignment mark 216 in the laser diode substrate 210 is aligned to the center of two metal bar alignment marks 238. However, in another embodiment, another number and/or another configuration of alignment marks 216 and/or 238 might be used. Further, the trench alignment mark 216 is shown as extending across the entire substrate 210. However, in another embodiment, the alignment mark trench 216 may extend across only a portion of the substrate 210.

Using the method 150, performance of the EAMR head may be improved. Because the alignment marks 216 and alignment marks 238 have locations and geometries that are well known, the desired tolerances in alignment may be achieved. Thus, optical losses due to misalignment between the emission exit 214 and the waveguide entrance 236 may be reduced. Thus, performance of the EAMR head being fabricated may be improved.

Figure 13:
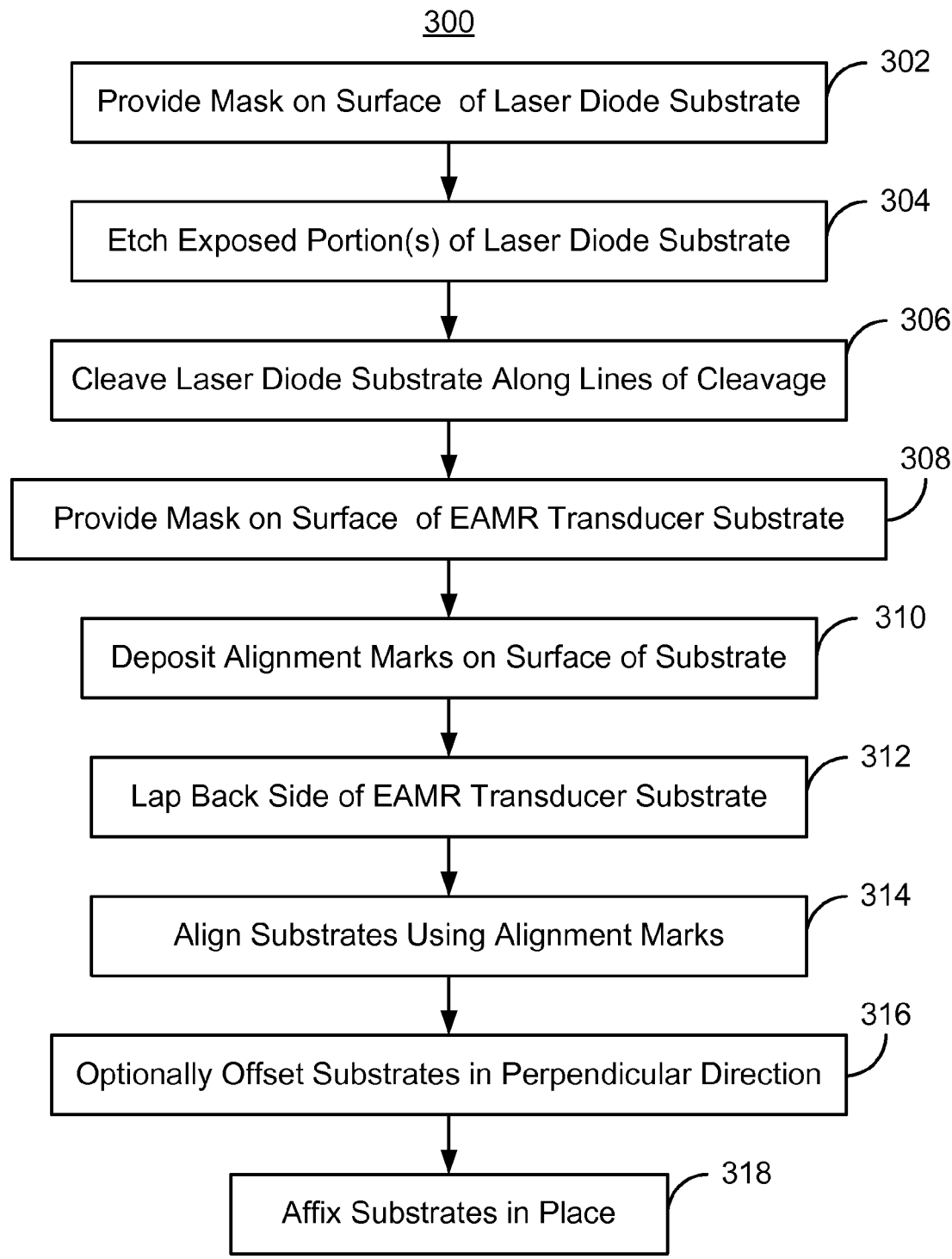
FIG. 13 is a flow chart depicting an exemplary embodiment of a method for aligning substrates for use in fabricating an EAMR head.

FIG. 13 depicts an embodiment of a method 300 for aligning two substrates. For simplicity, some steps may be omitted and some steps may include substep(s). Further, the steps of the method may be combined, interleaved, and/or performed in another order. The method 300 is described in the context of aligning a laser diode on a first substrate to waveguide on a second substrate. However, in other embodiments, the method 300 may be used for aligning other substrates. However, the method 150 may be used to form another device (not shown). FIGS. 14-18 are diagrams depicting substrates 350 and 380 during fabrication of the EAMR head. More specifically, FIGS. 14-18 depict substrates 350 and 380 during the method 300. For clarity, FIGS. 14-18 are not to scale. Further, for simplicity, not all components are labeled in FIGS. 14-18. The substrate 380 may be a slider including an EAMR transducer. The substrate 350 may be a laser diode formed in a semiconductor substrate. Referring to FIGS. 13-18, the method 300 is described in the context of substrates used in fabricating an EAMR head. The EAMR head being fabricated may be part of a merged head that also includes a read transducer (not shown) and resides on a slider of a disk drive.

Figure 14:
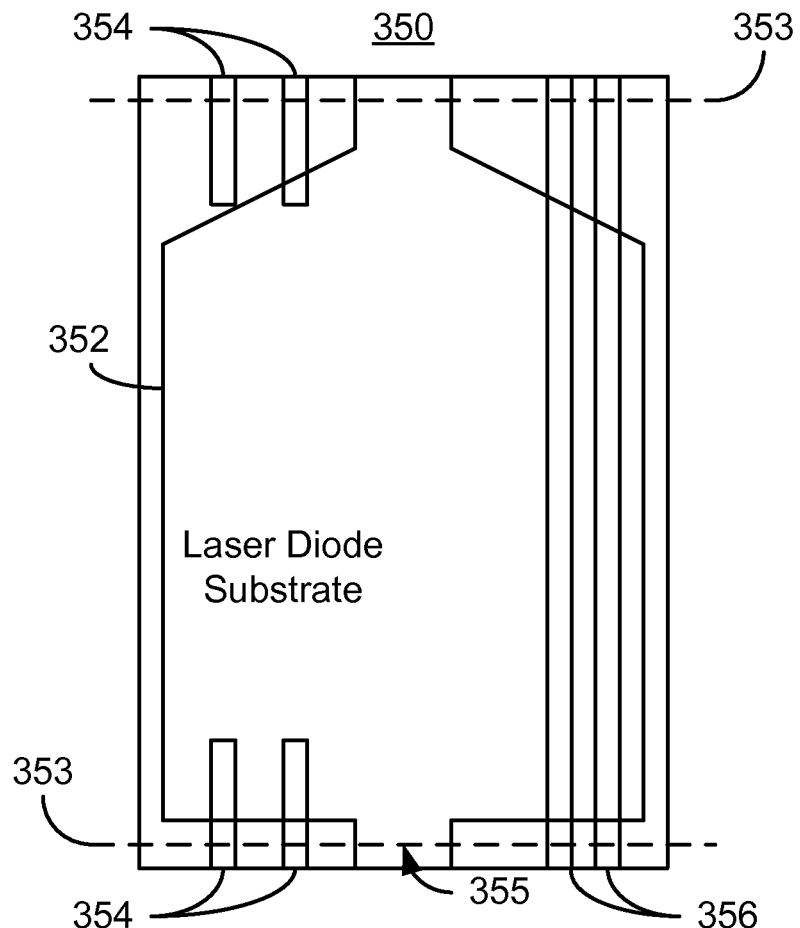
FIGS. 14-16 depict an exemplary embodiment of a laser diode substrate during alignment.

A first mask exposing a first portion of the first surface of the substrate for the laser diode is provided photolithographically, via step 302. The mask exposes the portion of the substrate 350 in which the trenches are to be formed. The exposed portion(s) of the laser diode substrate 350 exposed by the first mask are etched, via step 304. FIG. 14 depicts the surface 351 of the laser diode substrate 350 on which the trenches have been formed photolithographically. Thus, a laser diode 352 having an exit 355 is shown, as are lines of cleavage 353. Trenches 354 and 356 have been formed. The trenches 354 and 356 cross the cleavage lines 353 of the first substrate 304.

Figure 15:
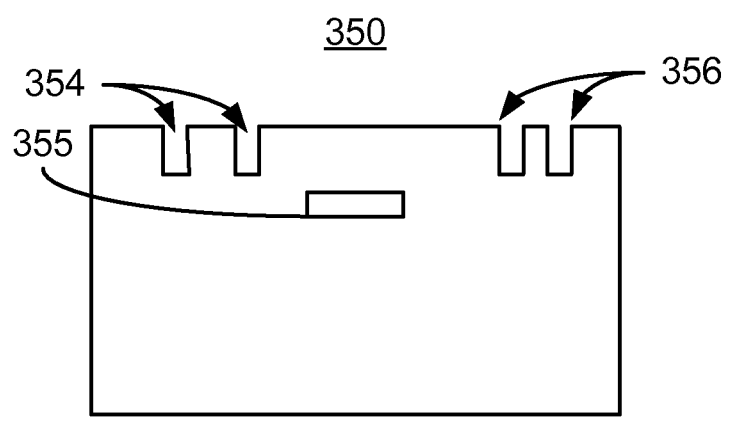
Figure 16:
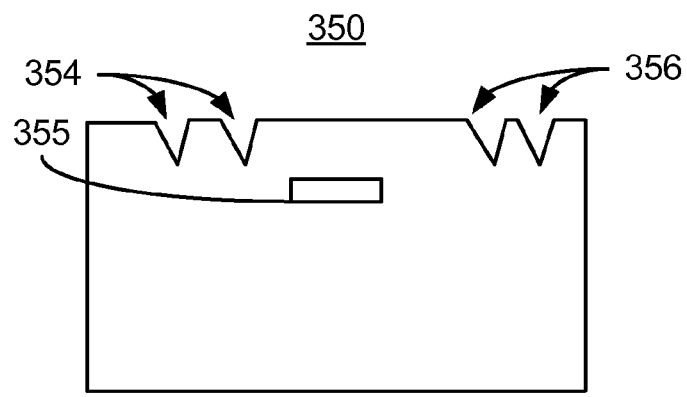

The laser diode substrate 350 is cleaved along the lines of cleavage 353, via step 304. FIGS. 15-16 depict embodiments of the laser diode substrate 350 after step 306 is performed. The view shown in FIGS. 15-16 is from the edges 353 formed by the substrate 350 being cleaved. Thus, the edge 353 corresponds to a cleavage line 353. FIG. 15 depicts an embodiment in which the trenches are formed using a dry etch such as an RIE. Thus, the trenches 354 and 356 have substantially vertical sidewalls. Also shown is the laser emission exit 355. FIG. 16 depicts an embodiment in which the trenches 354 and 356 are formed using an anisotropic wet etch. Thus, the trenches 354 and 356 have sloped sidewalls. However, in either case, the geometry and location of the trenches 354 and 356 with respect to the laser emission exit 355 are well known.

A mask that exposes a portion of the side of the substrate 380 for the EAMR transducer is photolithographically provided, via step 308. Step 308 is generally performed while the substrate 380 for the EAMR transducer is still part of a wafer. The mask may be provided at substantially the same time as the waveguide is being formed.

Figure 17:
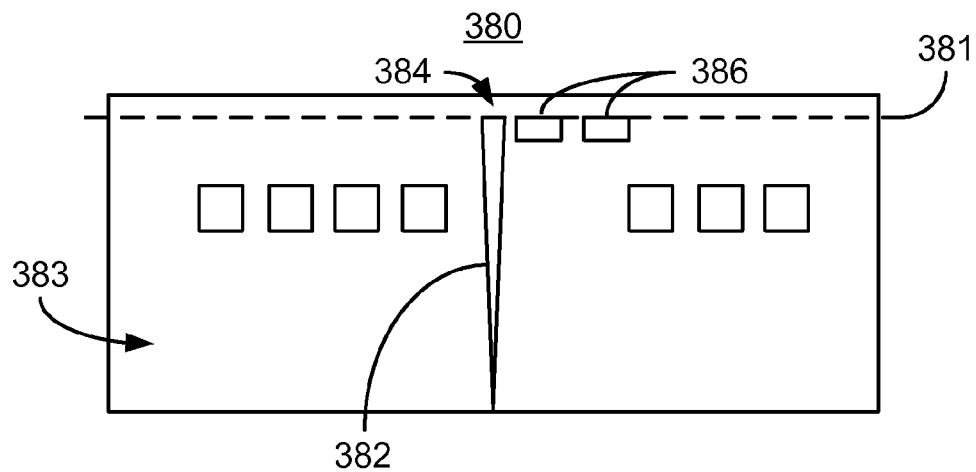
FIGS. 17-18 depict an exemplary embodiment of a slider/EAMR transducer substrate during alignment.

A metal layer that forms the alignment marks are deposited on the exposed portion of substrate 380, via step 310. The mask may also be removed. Also as part of step 310, a dielectric or other layer may be deposited to encase the metal. FIG. 17 depicts the side 383 of the substrate 380. Thus, a waveguide 382 and alignment marks 386 are shown. The waveguide 382 has a waveguide entrance 384 at the location 381 that will become the back side of the slider. However, the substrate 380 has not yet been lapped or otherwise processed to expose the surface 383.

Figure 18:
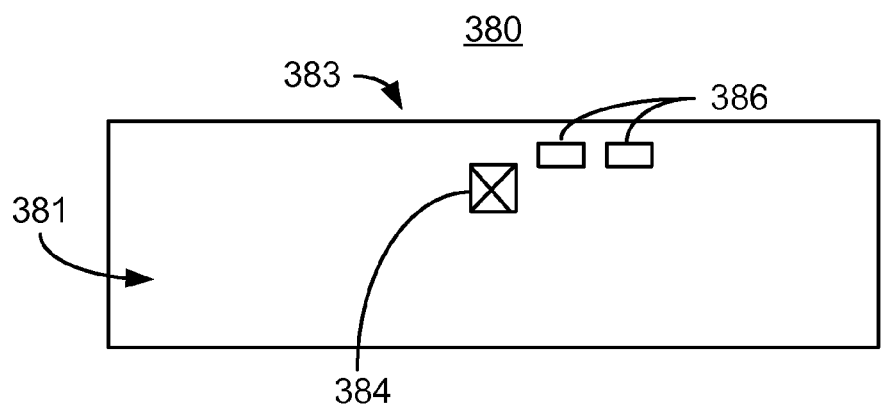

The back side of the substrate 380 is lapped to expose part of the alignment marks 386, via step 312. Step 312 may also include dicing the wafer to separate the individual sliders before lapping. FIG. 18 depicts the slider substrate 380 from the back side 381. Thus, alignment marks 386 and waveguide entrance 384 are shown. Also indicated is the side/trailing edge 383. The location and geometry of the alignment marks 386 with respect to the waveguide entrance 384 are well defined.

The alignment marks 354 and/or 356 on the laser diode substrate 350 are aligned to the alignment marks 386 on the substrate 380 to within a distance, via step 314. In some embodiments, the distance is not more than one micron. In some such embodiments, the distance may be less and the alignment better. Step 314 thus aligns the substrates 350 and 380 in a particular direction. In some embodiments, step 314 may also include offsetting the substrates 350 and 380 in a perpendicular direction in order to account for offsets between the relevant structures 355 and 384. However, in other embodiments, the substrates 350 and 380 may be offset in a perpendicular direction in a separate step, step 316.

The edge 353 of the laser diode substrate 350 is affixed to the back side of the second substrate 320, via step 318. Thus, steps 314-316 may be considered to correspond to the method 150. Thus, using the method 300, the alignment marks 354, 356, and 386 may be provided on one surface and used for alignment of structure on another surface/edge. As a result, the benefits of the method 150, including improved optical coupling between the waveguide 352 and laser diode 312 may be achieved. Consequently, performance of an EAMR head aligned using the method 300 may be improved.

We claim:

1. A method for aligning a laser diode on a first substrate to a waveguide on a second substrate, the first substrate including an edge and a first surface adjoining the edge, the laser diode having an emission exit on the edge, the second substrate including a back side and a side edge, the waveguide having a waveguide input on the back side and configured to direct light along the side edge, the method comprising:
   aligning a first alignment mark set on the first substrate to a second alignment mark set on the second substrate, the first alignment mark set corresponding to the emission exit, being formed on the first surface, being visible from the edge, an alignment mark of the first alignment mark set occupying adjoining portions of both the first surface and the edge, the second alignment mark set corresponding to the waveguide input, being formed on the side edge, and being visible from the back side; and
   affixing the edge of the first substrate to the back side of the second substrate.

2. The method of claim 1 wherein the first alignment mark set includes at least one trench formed in the first surface of the first substrate.

3. The method of claim 2 further comprising:
   removing a portion of the first substrate, forming the at least one trench therein.

4. The method of claim 3 wherein the step of removing the portion of the first substrate further includes:
   photolithographically providing a mask exposing the portion of the first substrate; and
   etching the portion of the first substrate exposed by the mask using at least one of a dry etch and a wet etch.

5. The method of claim 3 wherein the portion of the first substrate crosses at least one line of cleavage, the method further comprising:
cleaving the first substrate along a line of the at least one line to form the edge.

6. The method of claim 2 wherein each of the at least one trench has a depth of at least two and not more than ten microns.

7. The method of claim 2 wherein the at least one trench includes a plurality of trenches.

8. The method of claim 7 wherein the emission exit is between two trenches of the plurality of trenches.

9. The method of claim 1 wherein the emission exit and the first alignment mark set are formed using at least one photolithographic process.

10. The method of claim 1 method of claim 1 further comprising:
depositing at least one alignment mark for the second alignment mark set on the side edge of the second substrate.

11. The method of claim 10 wherein the step of depositing the at least one alignment mark further includes:
photolithographically providing a mask exposing a portion of the side edge of the second substrate corresponding to the second alignment mark set; and
depositing the at least one alignment mark on the portion of the side edge exposed by the mask.

12. The method of claim 11 further comprising:
lapping the back side of the second substrate, exposing a portion of the at least one alignment mark.

13. The method of claim 10 wherein the at least one alignment mark includes a plurality of metal bars.

14. The method of claim 10 wherein the waveguide input is between two of the plurality of metal bars.

15. A method for aligning a laser diode on a first substrate to a waveguide on a second substrate, the first substrate including an edge and a first surface adjoining the edge, the laser diode having an emission exit on the edge, the second substrate including a back side and a side edge, the waveguide having a waveguide input on the back side and configured to direct light along the side edge, the method comprising:
aligning a first alignment mark set on the first substrate to a second alignment mark set on the second substrate, the first alignment mark set corresponding to the emission exit, being formed on the first surface and being visible from the edge, the second alignment mark set corresponding to the waveguide input, being formed on the side edge, and being visible from the back side, wherein the aligning step aligns the first alignment mark set to the second alignment mark set in a first direction parallel to the edge and a second substantially direction perpendicular to the first direction;
affixing the edge of the first substrate to the back side of the second substrate; and
offsetting the first substrate from the second substrate after the aligning step and before the affixing step, the offsetting corresponding to a distance between the waveguide input and the emission exit in the second direction.

16. A method for aligning a laser diode on a first substrate to a waveguide on a second substrate, the first substrate including an edge and a first surface adjoining the edge, the laser diode having an emission exit on the edge, the second substrate including a back side and a side edge, the waveguide having a waveguide input on the back side and configured to direct light along the side edge, the method comprising:
aligning a first alignment mark set on the first substrate to a second alignment mark set on the second substrate, the first alignment mark set corresponding to the emission exit, being formed on the first surface and being visible from the edge, the second alignment mark set corresponding to the waveguide input, being formed on the side edge, and being visible from the back side, the aligning step further including aligning a first midpoint of a first mark of the first alignment mark set to a second midpoint of a second mark of the second alignment mark set; and
affixing the edge of the first substrate to the back side of the second substrate.

17. A method for aligning a laser diode on a first substrate to a waveguide on a second substrate, the first substrate including an edge and a first surface adjoining the edge, the laser diode having an emission exit on the edge, the second substrate including a back side and a side edge, the waveguide having a waveguide input on the back side and configured to direct light along the side edge, the method comprising:
photolithographically providing a first mask exposing a first portion of the first surface of the first substrate;
etching the first portion of the first substrate exposed by the first mask, forming at least one trench in the first substrate, the at least one trench having a cross section and a trench top, the trench to residing substantially along the first surface of the first substrate, the at least one trench corresponding to the emission exit and being at a nonzero angle from at least one cleavage line of the first substrate such that the at least one trench crosses the at least one line of cleavage;
cleaving the first substrate along a line of the at least one line to form the edge, the at least one trench being visible from the edge and forming a first alignment mark set, a trench of the at least one trench occupying adjoining portions of both the first surface and the edge such that at least a portion of the cross section is visible from the edge;
photolithographically providing a second mask exposing a second portion of the side edge of the second substrate;
depositing at least one deposited alignment mark on the second portion of the side edge exposed by the second mask;
lapping the back side of the second substrate thereby exposing a portion of the at least one deposited alignment mark on the back side, the at least one deposited alignment mark corresponding to the waveguide input and forming a second alignment mark set;
aligning the first alignment mark set to the second alignment mark set to within a distance, the distance being not more than one micron, the back side being in proximity to the edge; and
affixing the edge of the first substrate to the back side of the second substrate.

18. A system for aligning a laser diode on a first substrate to a waveguide on a second substrate, the first substrate including an edge and a first surface adjoining the edge, the laser diode having an emission exit on the edge, the second substrate including a back side and a side edge, the waveguide having a waveguide input on the back side and configured to direct light along the side edge, the system comprising:
a first alignment mark set on the first substrate, the first alignment mark set corresponding to the emission exit, being formed on the first surface and being visible on the edge, an alignment mark of the first alignment mark set occupying adjoining portions of both the first surface and the edge;
a second alignment mark set on the second substrate, the second alignment mark set corresponding to the waveguide input, being formed on the side edge, and being visible from the back side, the second alignment mark set being configured to be aligned with the first alignment mark set.

19. The system of claim 18 wherein the first alignment mark set includes at least one trench.

20. The system of claim 19 wherein each of the at least one trench has a depth of at least two and not more than ten microns.

21. The system of claim 19 wherein the at least one trench includes a plurality of trenches.

22. The system of claim 19 wherein the emission exit is between two trenches of the plurality of trenches.

23. The system of claim 18 wherein the second alignment mark set includes at least one deposited alignment mark.

24. The system of claim 23 wherein the at least one alignment mark includes a plurality of metal bars.

25. The method of claim 24 wherein the waveguide input is between two of the plurality of metal bars.

* * * * *